(12) United States Patent
Shiina

(10) Patent No.: US 10,495,934 B2
(45) Date of Patent: Dec. 3, 2019

(54) LIQUID CRYSTAL DISPLAY DEVICE

(71) Applicant: Japan Display Inc., Minato-ku (JP)

(72) Inventor: Hideki Shiina, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/955,724

(22) Filed: Apr. 18, 2018

(65) Prior Publication Data
US 2018/0364535 A1 Dec. 20, 2018

(30) Foreign Application Priority Data

Jun. 19, 2017 (JP) .................. 2017-119484

(51) Int. Cl.
| | | |
|---|---|---|
| *G02F 1/1362* | (2006.01) | |
| *G02F 1/1333* | (2006.01) | |
| *G02F 1/1343* | (2006.01) | |
| *H01L 27/12* | (2006.01) | |
| *G02F 1/1368* | (2006.01) | |

(52) U.S. Cl.
CPC .. *G02F 1/136286* (2013.01); *G02F 1/133345* (2013.01); *G02F 1/134363* (2013.01); *H01L 27/124* (2013.01); *H01L 27/1248* (2013.01); *G02F 2001/13629* (2013.01); *G02F 2001/13685* (2013.01); *G02F 2001/136295* (2013.01)

(58) Field of Classification Search
CPC ......... G02F 1/136286; G02F 1/133345; G02F 2001/13685; G02F 1/134363; G02F 2001/13629; H01L 27/124; H01L 27/1248; H01L 29/41733
See application file for complete search history.

(56) References Cited

U.S. PATENT DOCUMENTS

| | | | |
|---|---|---|---|
| 2005/0029521 A1* | 2/2005 | Yamasaki | ......... G02F 1/136213 257/72 |
| 2016/0026044 A1* | 1/2016 | Nam | ...................... G02F 1/1368 349/42 |
| 2016/0238903 A1 | 8/2016 | Morimoto et al. | |

FOREIGN PATENT DOCUMENTS

| | | | | |
|---|---|---|---|---|
| JP | 2001166311 A | * | 6/2001 | ....... G02F 1/136227 |
| JP | 2016-148807 | | 8/2016 | |

* cited by examiner

*Primary Examiner* — Jessica M Merlin
(74) *Attorney, Agent, or Firm* — Oblon, McClelland, Maier & Neustadt, L.L.P.

(57) ABSTRACT

The purpose of the invention is to prevent the line shaped irregularity in brightness and to improve contrast. The representative structure is as follows. A liquid crystal display device comprising: a TFT substrate including a plural scan lines and a plural video signal lines, a counter substrate opposing to the TFT substrate, and a liquid crystal layer sandwiched between the TFT substrate and the counter substrate; wherein an interlayer insulating film is formed between the scan lines and the video signal lines, a groove like recess is formed in the interlayer insulating film superposing with the video signal line.

17 Claims, 11 Drawing Sheets

LIQUID CRYSTAL DISPLAY DEVICE

CLAIM OF PRIORITY

The present application claims priority from Japanese Patent Application JP 2017-119484 filed on Jun. 19, 2017, the content of which is hereby incorporated by reference into this application.

BACKGROUND OF THE INVENTION (1) Field of the Invention

The present invention relates to a display device, specifically a liquid crystal display device.

(2) Description of the Related Art

A liquid crystal display device has a TFT substrate, a counter substrate opposing to the TFT substrate, and a liquid crystal layer sandwiched between the TFT substrate and the counter substrate. The TET substrate has plural pixels; each of the pixels has a pixel electrode and a thin film transistor (TFT). Each of the pixels is in an area surrounded by the scan lines and video signal lines. A transmittance of light in each pixel is controlled by liquid crystal molecules; thus, images are formed.

It is necessary to keep the electrical resistance of the video signal lines formed on the TFT substrate low to maintain a wring speed of the video signal data high to each of the pixels. On the other hand, it is difficult to widen the widths of the video signal lines to maintain the light transmittance rate of the pixels. Thus, thickness of the video signal line is made bigger.

On the other hand, if the thickness of the video signal lines is made bigger, reflection of light from the side surface of the video signal line becomes a problem. In other words, light from backlight comes from various directions to the video signal line; if the light from the backlight comes in an oblique direction to the surface of the TFT substrate, the light reflects at a side surface of the video signal line and goes to the display screen; sometimes this is conceived as a line shaped irregularities in brightness in the screen. This phenomenon renders degradation of contrast of a display in total.

The patent document 1 (Japanese patent laid open 2016-148807) discloses to make the width of the common metal wiring, which is superposed with the common electrode to decrease the resistance of the common electrode, wider than the width of the video signal line to stop the light reflected at the side surface of the video signal line (see e.g. FIG. 10).

SUMMARY OF THE INVENTION

The structure of the patent document 1 is to make the width of the common metal wiring, which is formed above the video signal line and along the video signal line, wide enough to stop the light reflected from the side surface of the video signal line. When the screen becomes high definition, however, it becomes difficult to make the width of the common metal wiring bigger.

Some of the display devices of high definition screen have a pixel pitch of the pixels of 30 μm (herein after micron) or less in a horizontal direction. As a result, it becomes difficult to make the width of the common metal wiring, which is formed above and along the video signal line, wider. By the way, the pixel pitch means a pitch of individual subpixels e.g. between the red pixel, the green pixel or the blue pixel, not a pitch of the sets of pixels of the red pixel, the green pixel and the blue pixel in this specification.

The purpose of the present invention is to realize the structure that can suppress a degradation of contrast of the display without making a width of the common metal wiring substantially bigger than a width of the video signal line.

The present invention overcomes the above explained problem; the concrete structures are as follows.

(1) A liquid crystal display device comprising: a TFT substrate including a plural scan lines and a plural video signal lines, a counter substrate opposing to the TFT substrate, and a liquid crystal layer sandwiched between the TFT substrate and the counter substrate; wherein an interlayer insulating film is formed between the scan lines and the video signal lines, a groove like recess is formed in the interlayer insulating film superposing with the video signal line.

(2) The liquid crystal display device according to (1); wherein a cross section of the groove like recess has a side wall, the edge of the video signal line exists on the side wall of the groove like recess.

(3) The liquid crystal display device according to (1); the edge of the video signal line has a side surface, the side surface tilts in a first angle to the normal direction of the TFT substrate so that the side surface faces a major surface of the liquid crystal layer in oblique direction.

DETAILED DESCRIPTION OF THE PREFERRED EMBODIMENTS

The present invention will be described in detail referring to the following embodiments.

Figure 1:
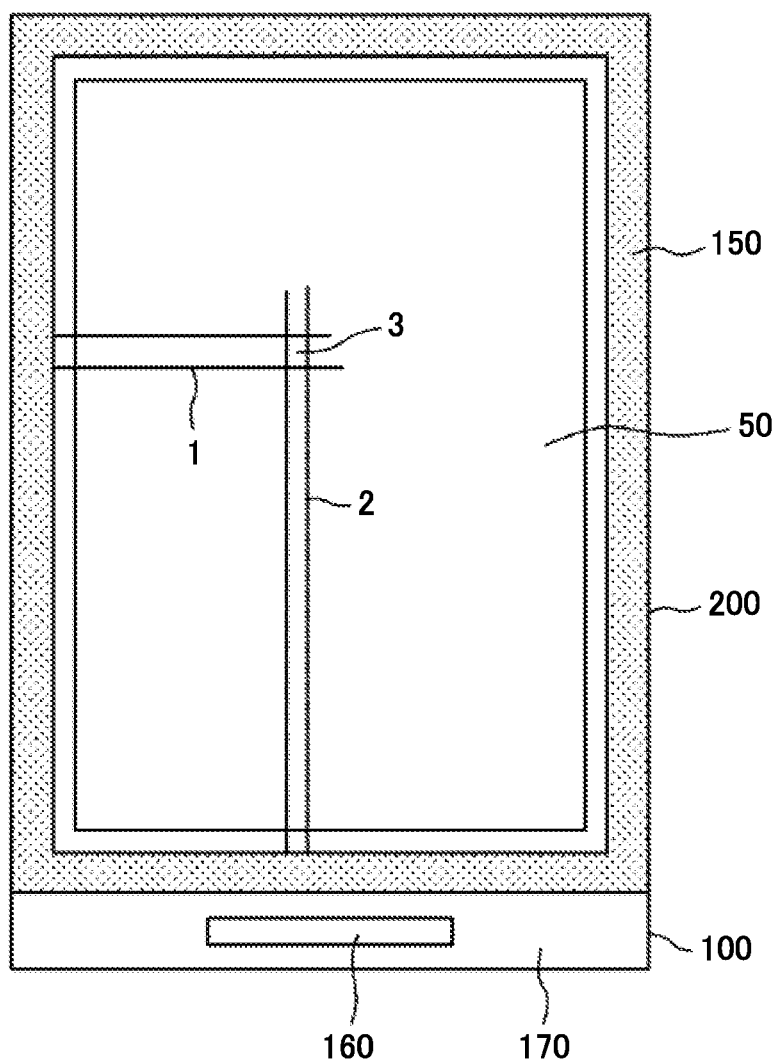
FIG. 1 is a plan view of the liquid crystal display device, in which the present invention is applied.

FIG. 1 is a plan view of a liquid crystal display device. In FIG. 1, the TFT substrate 100 and the counter substrate 200 adhere to each other via the sealing material 150; the liquid crystal is sandwiched between the TFT substrate 100 and the counter substrate 200. The TFT substrate 100 is made bigger than the counter substrate 200; the portion of the TFT substrate 100 that doesn't overlap with the counter substrate 200 is the terminal area 170. In the terminal area 170, the driver IC 160 that drives the liquid crystal panel is installed; and the terminals for connection with a flexible wiring substrate are formed. The flexible wiring substrate is for supplying powers, video signals, scan signals, and so on, to the liquid crystal display panel. In this specification, generally, the liquid crystal display device means to include the liquid crystal panel and the backlight; however, in some cases the liquid crystal display device may mean only the liquid crystal panel.

In FIG. 1, the scan lines 1 extend in a lateral direction, and arranged in a longitudinal direction. The video signal lines 2 extend in the longitudinal direction, and arranged in the lateral direction. The pixel 3 is formed in the area surrounded by the scan lines 1 and the video signal lines 2. A pixel electrode is formed in each of the pixels 3. In a high definition display, the pitch of the pixels in the direction that the scan line extends is as small as 30 μm (herein after micron). A backlight is set at rear side of the TFT substrate 100.

Figure 2:
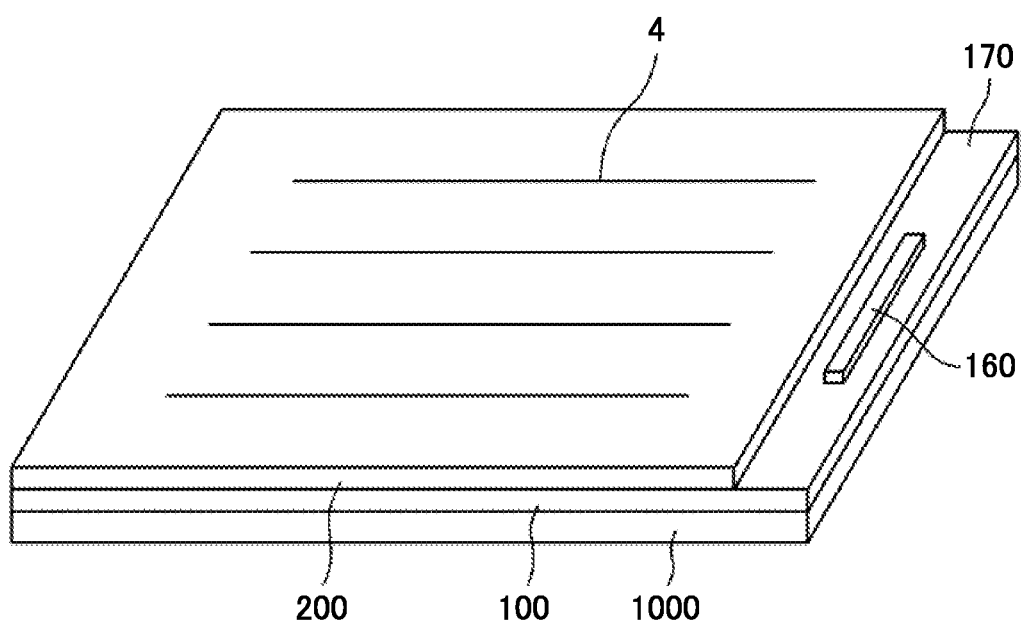
FIG. 2 is a perspective view of the liquid crystal display device.

FIG. 2 is a perspective view of the liquid crystal display device depicted in FIG. 1. The backlight 1000 is set on the back of the liquid crystal display panel, which is constituted by the TFT substrate 100 and the counter substrate 200. In the liquid crystal display panel, the images are formed by controlling a transmittance of the light from the backlight 1000 in each of the pixel. The light from the backlight 1000 is not collimated, thus, the light from the backlight 1000 impinges to the liquid crystal panel in various directions.

In FIG. 2, the video signal lines extend in the direction of long side of the TFT substrate 100. In the high definition displays, a thickness of the video signal line becomes thick to maintain the transmittance of light in the pixel and to keep the electrical resistance of the video signal line low. As a result, the light from the backlight 1000 tends to reflect at the side surface of the video signal line 2.

If the light reflected from the side surface of the video signal line 2 goes to the screen, it becomes a leak of light; consequently, the contrast of the images in the display is degraded. Further, since the reflection from the side surface of the videos signal line 2 occurs along the video signal line 2, the line shaped irregularity in brightness appears along the video signal line as depicted by notation 4 in FIG. 2. FIG. 2 is an example that four line shaped irregularities in brightness appear. That line shaped irregularities aggravate the impression of the screen. The present invention prevents the reflection from the video signal line, thus, prevents the line shaped irregularities as depicted by notation 4 in FIG. 2.

Figure 3:
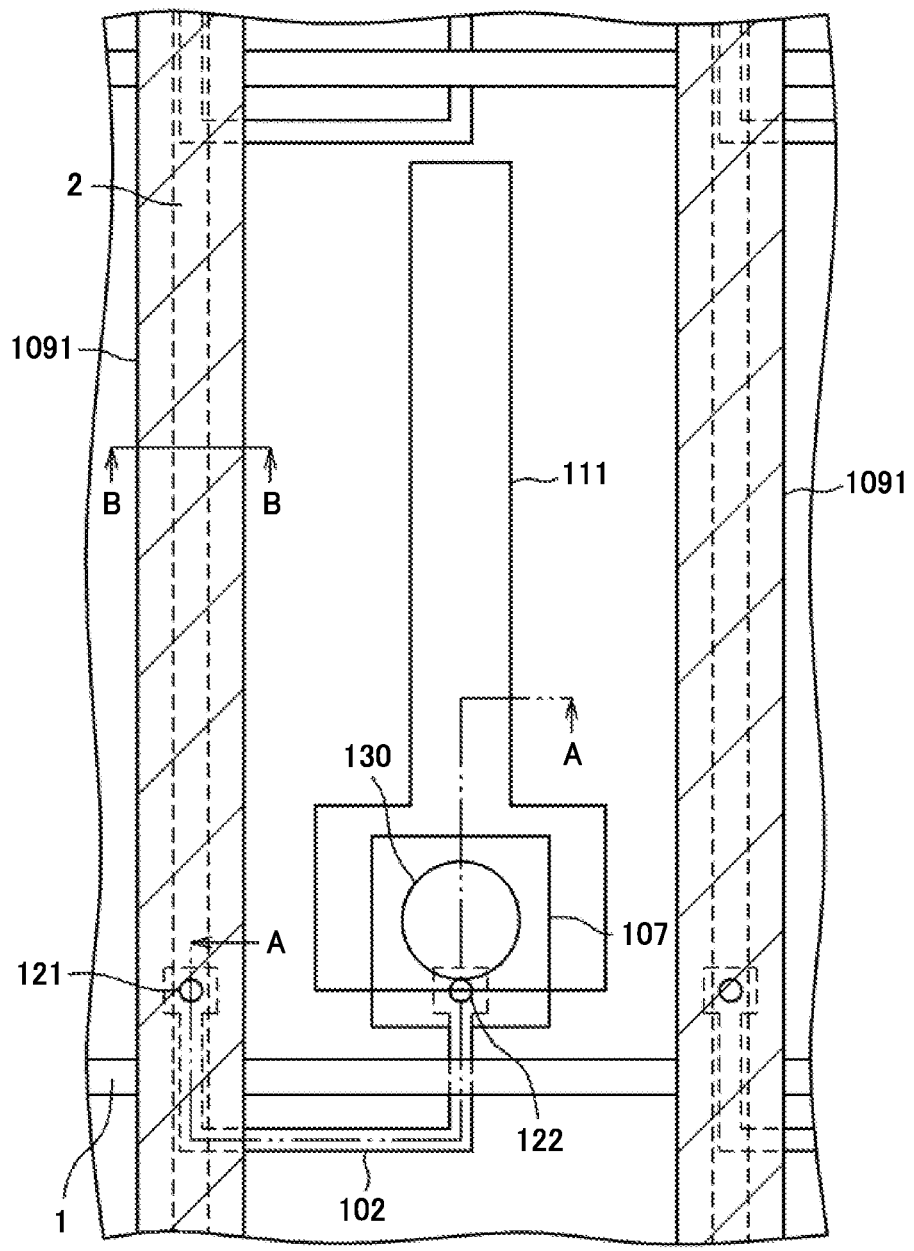
FIG. 3 is a plan view of the display area of the liquid crystal display device.

FIG. 3 is a plan view of the pixel as a comparative example to the present invention. FIG. 3 is an example of IPS (In Plane Switching) type liquid crystal display device. In FIG. 3, the scan lines 1 extend in a lateral direction and arranged in a longitudinal direction; the video signal lines 2 extend in the longitudinal direction and arranged in the lateral direction; the pixel electrode 111 is formed in the area surrounded by the scan lines 1 and the video signal lines 2. The semiconductor layer 102 connects with the video signal line 2 via through hole 121, extends under the video signal line 2. When the semiconductor layer 102 goes through under the scan line 1, the first TFT is formed at the place where the semiconductor layer 102 and the scan line 1 overlap. The semiconductor layer 102 bends crank like, and extends, through under the scan line 1, to the pixel electrode 111, wherein the second TFT is formed at the region where the semiconductor layer 102 and the scan line 1 overlap.

The semiconductor layer 102 connects with the source electrode 107 via the through hole 122. The source electrode 107 connects with the pixel electrode 111 via the through hole 130. The diameter of the through hole 130 is big because it is formed in the thick organic passivation film.

In FIG. 3, the pixel electrode 111 forms an electric field between the plane shaped common electrode sandwiching the capacitive insulating film, which will be explained later, to rotate the liquid crystal molecules, thus, controls the transmittance of the light from the backlight. In FIG. 3, since the pitch of the pixels in the direction the scan line extends is as small as 30 micron, the pixel electrode 111 is one stripe shaped; however, when the size of the pixel becomes bigger, the pixel electrode 111 can be a comb like electrode, which has a slit inside.

Since the pitch of the pixels is small, the width of the video signal line 2 cannot be bigger to maintain the transmittance of the pixel. The resistance of the video signal line 2, however, must be low to keep the writing speed of the video signals high. Consequently, the thickness of the video signal line 2 becomes thick. As explained later, however, a reflection of light form the backlight at the side surface of the video signal line 2 becomes a problem.

Figure 4:
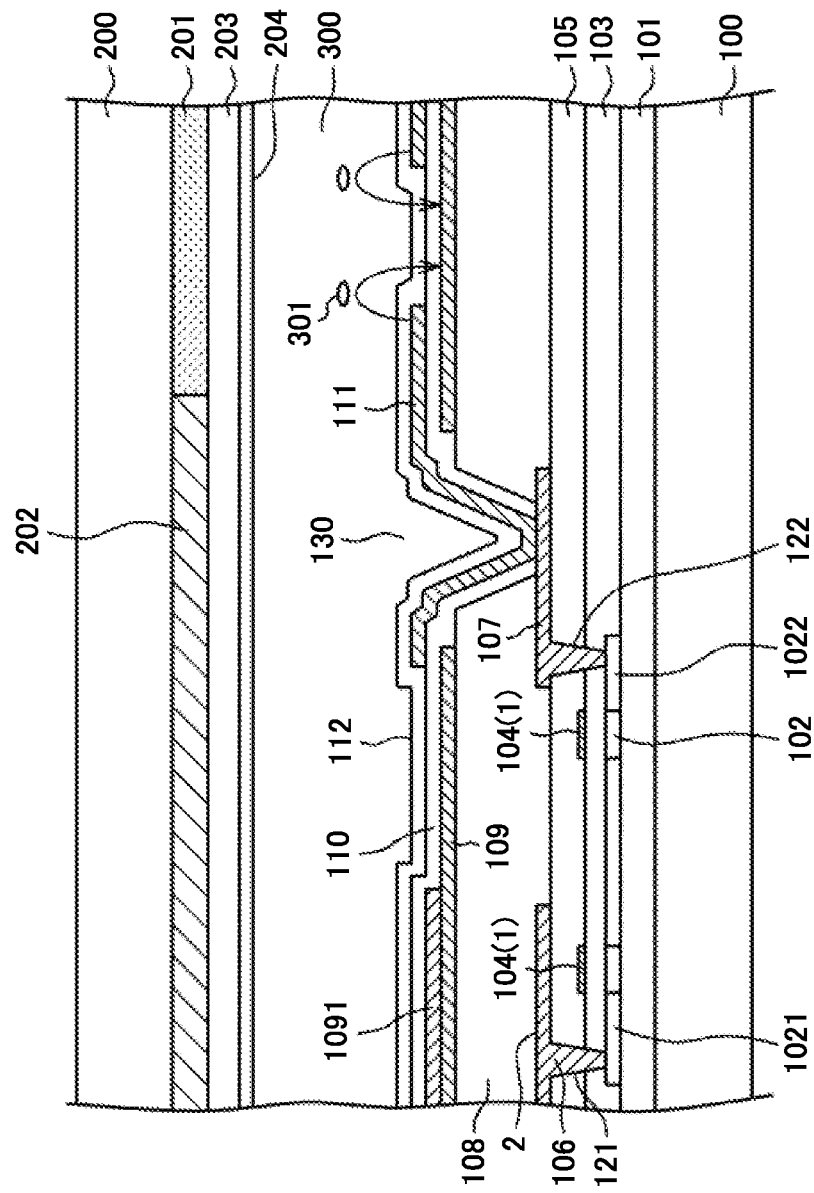
FIG. 4 is a cross sectional view along A-A line in FIG. 3.

FIG. 4 is a cross sectional view along A-A line of FIG. 3. In FIG. 4, the undercoat 101 is formed on the TFT substrate 100 formed by e.g. glass. If the liquid crystal display device is bendable, a thickness of the glass substrate is 0.2 mm or less, or the TFT substrate 100 is formed by resin, like polyimide.

The undercoat 101 prevents the semiconductor layer 102, which is formed later, from being contaminated by impurities from the glass substrate 100 or the resin substrate 100. The undercoat 101 is generally a laminated film of the silicon nitride (herein after SiN) film and the silicon oxide (herein after SiO) film. The semiconductor layer 102 is formed on the undercoat 101. The semiconductor layer 102 is formed as follows. The a-Si is formed by CVD (Chemical Vapor Deposition); then the excimer laser is irradiated to the a-Si to transform the a-Si to the Poly-Si. By the way, the undercoat 101, which is constituted by the SiN film and the SiO film, and the a-Si, which is transformed to be the semiconductor layer are formed by CVD continuously.

The semiconductor layer 102 is patterned; then the gate insulating film 103 is formed on the semiconductor layer 102. The gate insulating film 103 is a SiO film that is formed by CVD using (Tetraethyl orthosilicate) as the material. The gate electrode 104 is formed on the gate insulating film 103. The gate electrode 104 is made of e.g. MoW (Molybdenum Tungsten) alloy, which is formed by sputtering, and patterned. In the structure of FIG. 3, the scan line works as the gate electrode 104, wherein two TFTs are formed when the semiconductor layer 102 goes through under the scan line 1 twice; in other words, the TFT of two gate electrodes 104 is formed in FIG. 4.

After the gate electrode 104 is patterned, the ion implantation of P (Phosphorus) or B (Boron) is applied to the semiconductor layer 102 using the gate electrode 104 as the mask to give conductivity to the semiconductor layer 102 except the portion that is covered by the gate electrode 104. As a result, the drain region 1021 and the source region 1022 are formed in the semiconductor layer 102.

After that, the interlayer insulating film 105 is formed covering the gate electrode 104 by the SiN film or the SiO film, or the laminated film of the SiN film and the SiO film. The interlayer insulating film 105 can be formed by CVD. Subsequently, the through hole 121 is formed in the interlayer insulating film 105 and the gate insulating film 103 to connect the drain region 1021 of the semiconductor 102 and the video signal line 2. In this case, the video signal line 2 is a drain electrode 106. On the other hand, the source region 1022 is connected to the source electrode 107 via through hole 122 formed in the interlayer insulating film 105 and the gate insulating film 103.

The organic passivation film 108 is formed by e.g. acrylic resin covering the drain electrode 106 and the source electrode 107. Since the organic passivation film 108 also works as a flattening film, it is formed as thick as 2 to 4 micron. Organic passivation film 108 is formed by photosensitive resin; thus, an additional photoresist process is not necessary to form the through hole 130. Since the material for the organic passivation film 108 is a positive photosensitive material, the through hole 130 is formed where the light is irradiated. In the meantime, other than acrylic resin, the organic passivation film 108 can be made of silicone resin, polyimide, etc.

The common electrode 109 is formed by transparent oxide conductive film as ITO (Indium Tin Oxide) in a plane shape on the organic passivation film 108. The common electrode 109 is formed continuously in plural pixels in common; however, it is not formed in the through hole 130. After the common electrode 109 is patterned, the capacitive insulating film 110 is formed by SiN covering the common electrode 109. The capacitive insulating film 110 is formed by CVD. Since the capacitive insulating film 110 is formed after the organic passivation film 108 is formed, it cannot be formed by high temperature process; thus, it is formed low temperature CVD as 200 (herein after centigrade).

The pixel electrode 111 is formed by transparent oxide conductive film as ITO (Indium Tin Oxide) in a comb shape or a stripe shape on the capacitive insulating film 110. The insulating film 110, which is between the common electrode 109 and the pixel electrode 111, forms a holding capacitance, thus, it is called the capacitive insulating film 110.

The through hole is formed in the capacitive insulating film 110 in the through hole 130, which is formed in the organic passivation film 108, to connect the pixel electrode 111 and the source electrode 107.

The alignment film 112 is formed covering the pixel electrode 111 and the capacitive insulating film 110. The alignment film 112 determines the initial alignment of the liquid crystal molecules 301; the alignment process for the alignment film 112 is made by rubbing method or optical alignment method. In the IPS type liquid crystal display device, the optical alignment process is more suitable. When the video signal is applied to the pixel electrode 111, a line of force is generated between the pixel electrode 111 and the common electrode 109 as depicted by arrows in FIG. 4, as a result, the liquid crystal molecules 301 are rotated, consequently, transmittance of the liquid crystal layer 300 is changed; thus, display images are formed.

In FIG. 4, the counter substrate 200 is set opposing to the TFT substrate 100 sandwiching the liquid crystal layer 300. If the display device is required to be flexible, the counter substrate 200 can be made of resin, like polyimide. The color filter 201 and the black matrix 202 are formed on the inside surface of the counter substrate 200. The color filter 201 is formed at the portion where the light from the backlight is controlled to form the display images. On the other hand the black matrix 202 is formed at the portion where controlling of the light from the backlight is difficult, as e.g. the place where the through hole 130 is formed; thus, leak of the light from the backlight is suppressed.

The overcoat film 203 made of transparent organic material as e.g. acrylic is formed covering the color filter 201 and the black matrix 202. The alignment film 204 is formed on the overcoat film 203. The alignment process for the alignment film 204 is made by rubbing method or optical alignment method as the alignment film 112.

Figure 5:
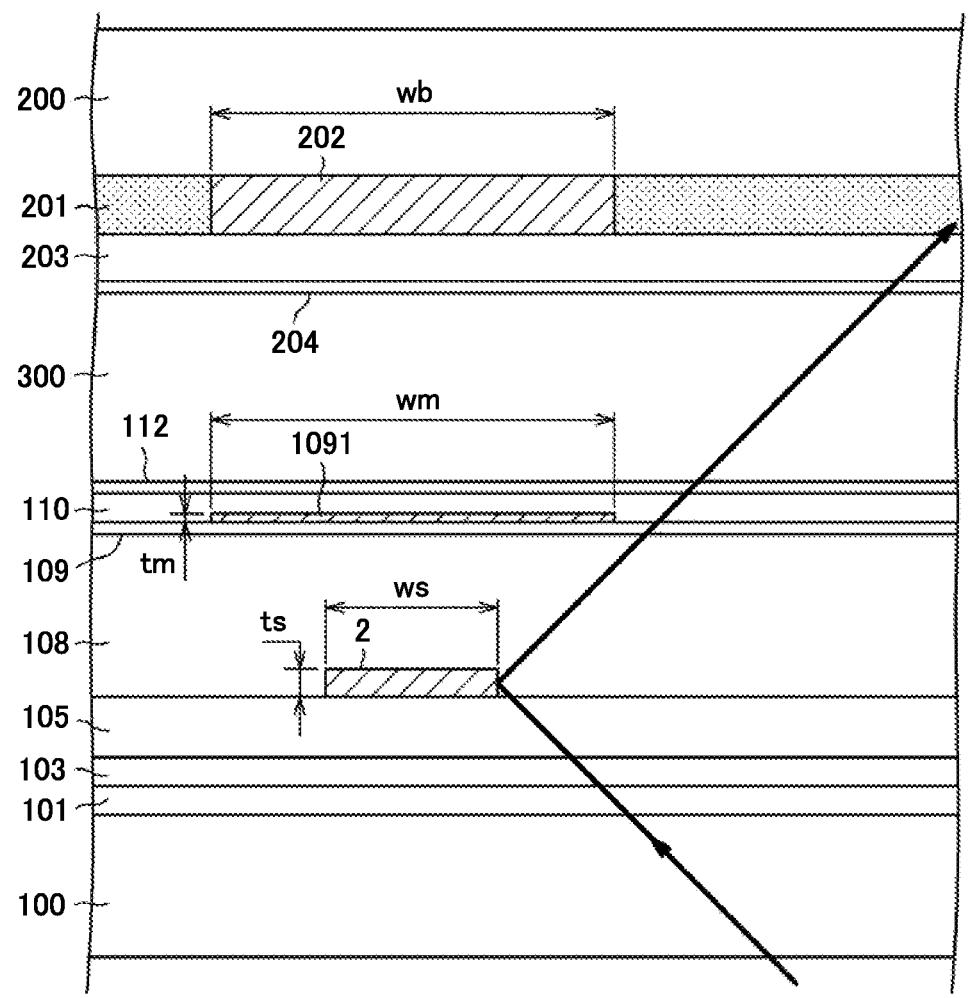
FIG. 5 is a cross sectional view along B-B line in FIG. 3.

FIG. 5 is cross sectional view along the line A-A in FIG. 3. In FIG. 5, the undercoat 101, gate insulating film 103, and the interlayer insulating film 105 are formed on the TFT substrate 100 in this order. The video signal line 2 is formed on the interlayer insulating film 105. The video signal line 2 is made thick to decrease the resistance. The thickness is of the video signal line 2 is e.g. 683 nm, the width ws is e.g. 1.75 micron. The organic passivation film 108 is formed covering the video signal line 2.

The common electrode 109 is formed by ITO in a plane shape on the organic passivation film 108. The common metal wiring 1091 is formed on the common electrode 109, and above the video signal line 2. Since the resistance of the common electrode 109, which is made of ITO, is high, the common metal wiring 1091 is formed to decrease the resistance of the common electrode 109. The width wm of the common metal wiring 1091 is e.g. 4.5 micron; the thickness is e.g. 78 nm. The thickness of the common metal wiring 1091 can be chosen in a range of 20 nm to 130 nm. The capacitive insulating film 110 is formed covering the common electrode 109 and the common metal wiring 1091; the alignment film 112 is formed on the capacitive insulating film 110.

In FIG. 5, the counter substrate 200 is formed opposing to the TFT substrate 100 sandwiching the liquid crystal layer 300. The color filter 201 and the black matrix 202 are formed on the inside surface of the counter substrate 200; the overcoat film 203 is formed on the color filter 201 and the black matrix 202; the alignment film 204 is formed on the overcoat film 203. The width wb of the black matrix 202 is approximately the same as the width wm of the common metal wiring 1091 or slightly wider than the width wm of the common metal wiring 1091. In FIG. 5, the width wb of the black matrix is e.g. 5 micron.

Figure 6:
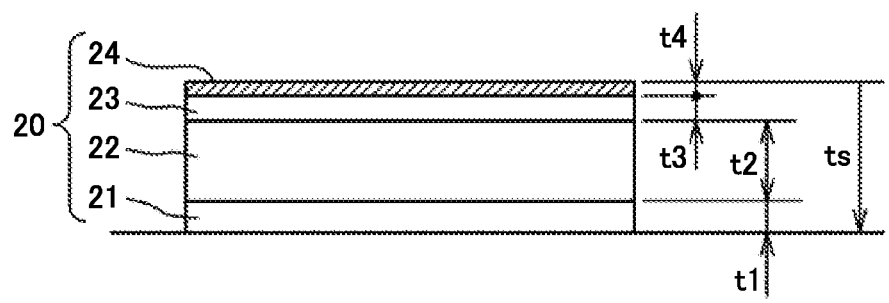
FIG. 6 is a cross sectional view that shows the structure of the video signal line.

FIG. 6 is a cross sectional view that shows the structure of the video signal line 2. The video signal line 2 is constituted by four layers. The lower most layer is the base metal 21, which is made of e.g. Titan (Ti) layer, the thickness t1 is e.g. 130 nm. The Aluminum (Al) layer 22 is formed on the base metal 21. The Aluminum layer 22 is actually an alloy that includes a slight amount of silicon (Si). The thickness t2 of the Aluminum layer 22 is e.g. 500 nm. The cap metal layer 23 is formed on the Aluminum layer 22 by e.g. Ti at a thickness of t3, which is e.g. 45 nm. The anti-reflection film 24 is formed on the cap metal layer 23 by e.g. Titan Nitride (TiN). The anti-reflection film 24 is for preventing the reflection of external light; the thickness of t4 of the anti-reflection film 24 is e.g. 8 nm.

Back to FIG. 5, the light from the backlight, which is disposed on the back of the liquid crystal display panel, is not necessarily collimated; consequently, light impinges to the liquid crystal display panel in various directions. The arrow in FIG. 5 depicts that the light from the backlight impinges to the liquid crystal display panel in an oblique direction. As depicted in FIG. 5, the light impinges in an oblique direction to the liquid crystal display panel is reflected at the side surface of the video signal line 2, and goes to the screen.

The light depicted by the arrow deteriorates the contrast of the screen. Further, as explained in FIG. 2, the reflected light interferes with each other, and thus, tends to form the line shaped irregularity in brightness in the screen. The effects of the reflected light can be avoided if the reflected light is shaded by the common metal wiring 1091 formed on the common electrode 109. However, if the width of the common metal wiring 1091 becomes wider to stop the reflected light, the opening ratio of the pixel decreases.

Figure 7:
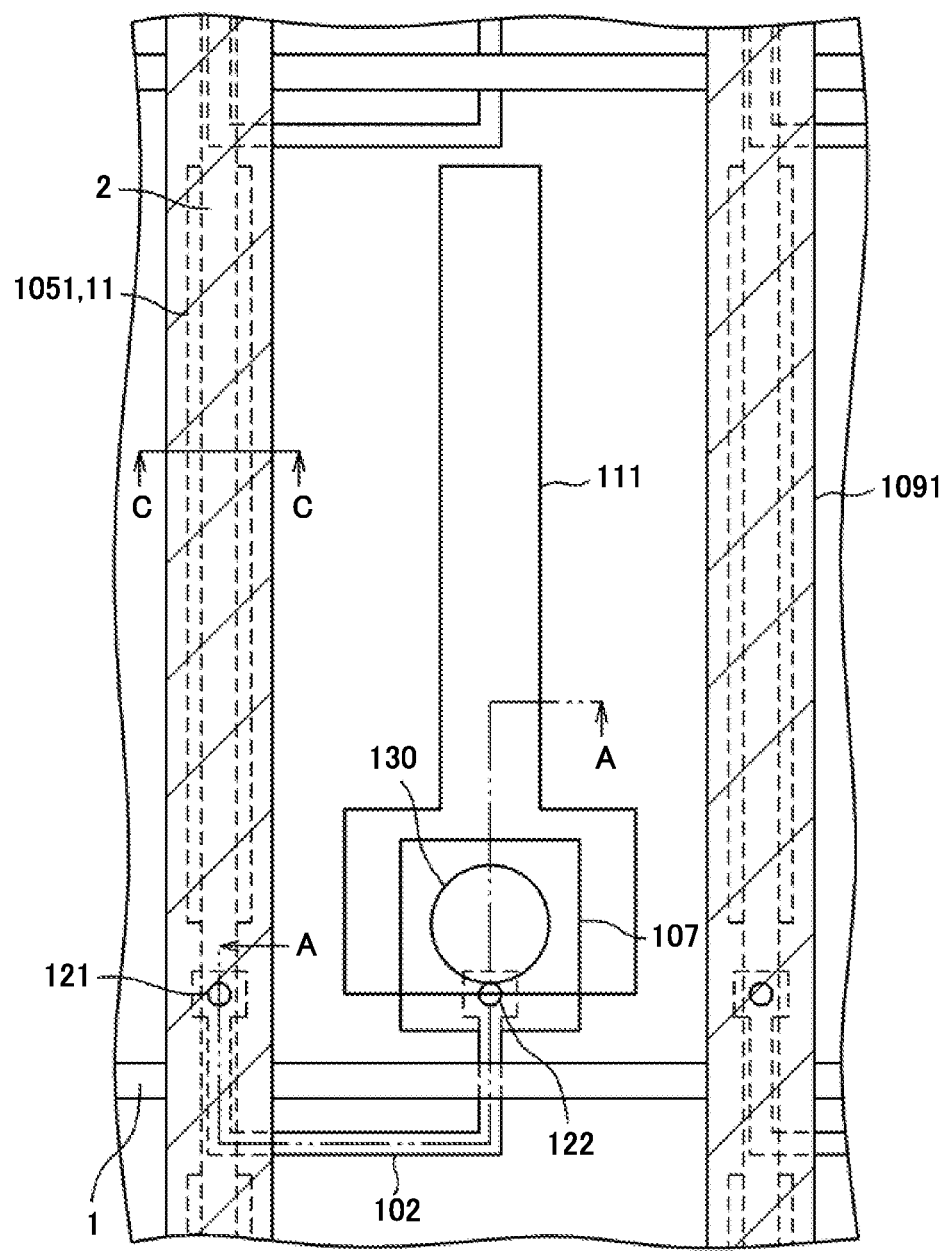
FIG. 7 is a plan view of the display area of the liquid crystal display device according to the present invention.

FIG. 7 is a plan view of the pixel structure in the present invention. FIG. 7 differs from FIG. 3 in that the groove like through hole 1051 is formed in the interlayer insulating film 105 under the video signal line 2. Further, the etching stopper 11 is formed in approximately the same width as the groove like through hole 1051 on the same layer as the gate electrode 104 (scan line 1).

In FIG. 7, the groove like through hole 1051 and the etching stopper 11 are formed at a position that doesn't overlap with the semiconductor layer 102 in a plan view. The reason is that: the etching stopper 11 is formed by the metal layer that is simultaneously formed with the scan line 1; thus, the etching stopper 11 is separated from the scan line 1 to be insulated from the scan line 1. Since the etching stopper 11 cannot be formed in the separating area, the groove like through hole 1051 cannot be formed near the scan line 1, either. However, even the groove like through hole 1051 is not formed near the scan line as depicted in FIG. 7, the black matrix 202 is formed on the counter substrate 200 overlapping with the scan line 1 in a plan view; thus, effects of the light reflected at the surface of the video signal line 2 can be avoided.

Figure 8:
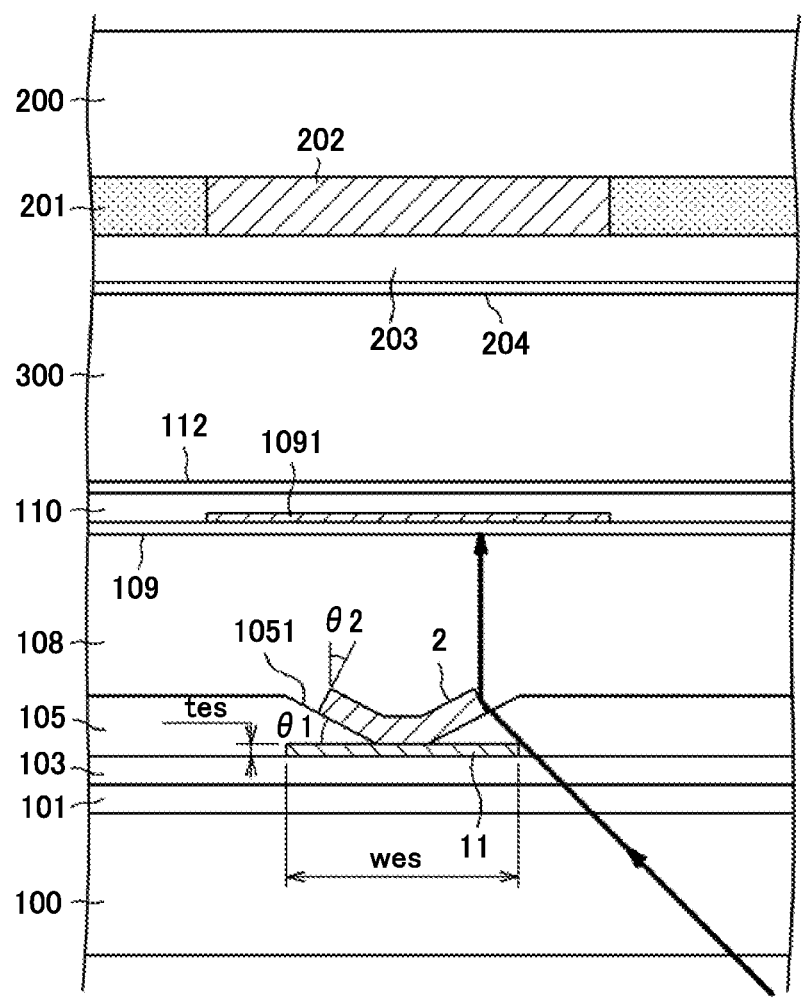
FIG. 8 is a cross sectional view along C-C line in FIG. 7.
Figure 9:
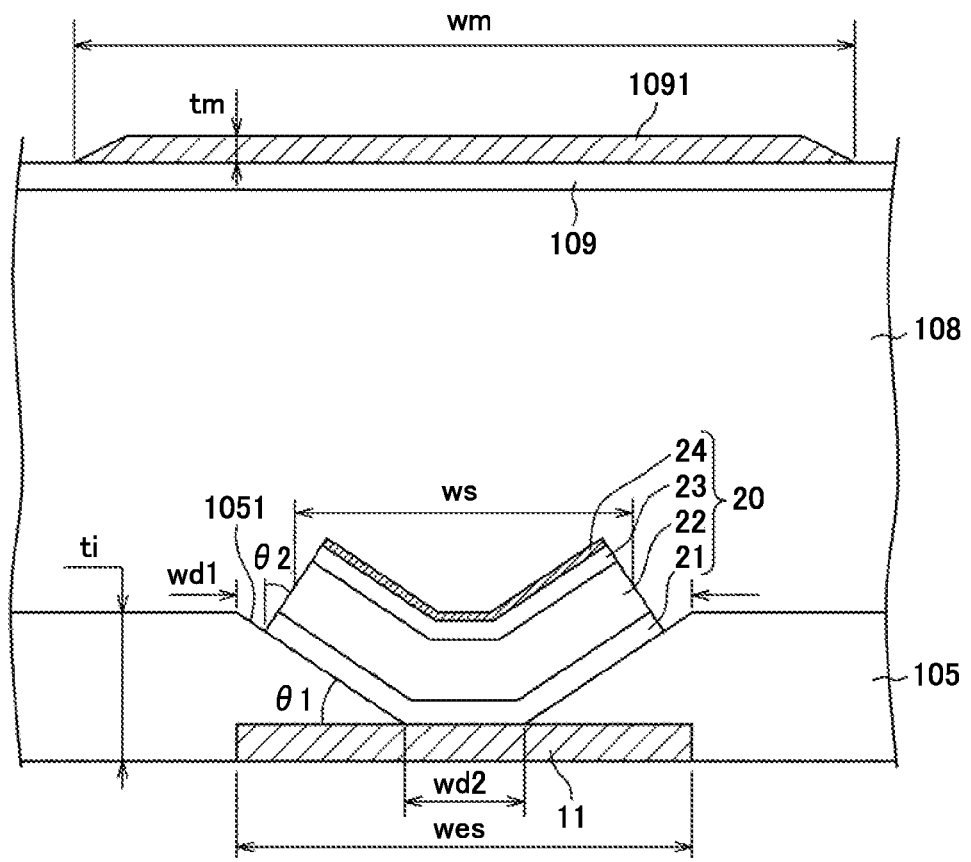
FIG. 9 is an enlarged cross sectional view at the video signal line of FIG. 7.

FIG. 8 is a cross sectional view along the line C-C in FIG. 7. FIG. 9 is an enlarged view near the video signal line 2 in FIG. 8. FIGS. 8 and 9 differ from FIG. 5 in that the groove like through hole 1051 is formed in the interlayer insulating film 105 where the video signal line 2 is disposed. The interlayer insulating film 105, which has an e.g. approximately 650 nm thickness, is a laminated film of a SiN film (thickness of 250 nm) and a SiO film (thickness of 400 nm). The cross section of the groove like through hole 1051 has a bottom and a tapered side wall; the edge of the video signal line 2 exists on the side wall of the groove like through hole 1051. The width wd1 of the upper part of the groove like through hole 1051, which is e.g. 2 micron, is slightly wider than the width ws of the video signal line 2. The etching stopper 11, which is formed on the same layer as the scan line 1, exists at the bottom of the groove like through hole 1051, consequently, the video signal line 2 and the etching stopper 11 are electrically connected.

The role of the etching stopper 11 is to prevent the gate insulating film 103, which is formed under the interlayer insulating film 105, from being etched when the groove like through hole 1051 is formed in the interlayer insulating film 105 by etching. Since the etching stopper 11 is simultaneously formed with the scan line 1, it is formed by the same material as the scan line 1 as e.g. Molybdenum Tungsten alloy (MoW) in a thickness tes of e.g. 250 nm.

In FIGS. 8 and 9, the width wes of the etching stopper 11 is the same as the upper width wd1 of the groove like through hole 1051. However, since the role of the etching stopper 11 is to prevent the gate insulating film 103 from being etched when the interlayer insulating film is etched, the width wes can be as narrow as the width wd2 of the bottom of the groove like through hole 1051. If the width wes of the etching stopper 11 is too wide, it causes a decreasing of the opening ratio; thus, the width wes is preferably equal to or less than the width of the upper width wd1 of the groove like through hole 1051.

The feature of the present embodiment is that the edge of the video signal line 2 in the width direction is on the side wall of the groove like through hole 1051, consequently, the edge of the video signal line 2 is oblique in regard to the major surface of the TFT substrate 100. For example, if an angle of inclination of the side wall of the groove like through hole 1051 is θ1 with respect to the major surface of the TFT substrate 100, the side surface of the video signal line 2 tilts with respect to the normal direction of the TFT substrate 100 in an angle of θ2, which is the same as θ1.

Certain effect can be expected if the angle of θ2, which is a tilt angle of the video signal line 2 with respect to the normal direction of the TFT substrate 100, is larger than zero; however, it is preferable that the angle of θ2 is 15 degree or more to get an apparent effect. In this case, according to the structure of FIG. 9, an angle of inclination θ1 of the groove like through hole 1051 is also 15 degree or more. However, if the angle of θ2 is too big, a reflection by the side surface of the video signal line 2 against the light that comes from the liquid crystal layer side tends to be a problem. Therefore, the angle of θ2 is preferably 45 degree or less.

In addition to that, when the edge of the video signal line 2 is set on the side wall of the groove like through hole 1051, fabrication of the video signal line 2 or the groove like through hole 1051 becomes difficult if the inclination θ1 of the groove like through hole 1051 is too big. Consequently, the angle of inclination θ1 is preferably 45 degree or less. Therefore, the range of the angle of inclination θ1 is preferably between 15 degree and 45 degree.

In FIG. 9, the organic passivation film 108 is formed over the video signal line 2; the common electrode 109 is formed on the organic passivation film 108; the common metal wiring 1091 is formed on the common electrode 109 to decrease the electrical resistance of the common electrode 109. The width wm of the common metal wiring 1091 is wider than the width ws of the video signal line 2; the width wm of the common metal wiring 1091 is e.g. 4.5 micron. If the thickness of the common metal wiring 1091 is big, a reflection from the side surface becomes a problem as explained with respect to the video signal line 2; however, the thickness tm of the common metal wiring 1091 is e.g. 78 nm, which is much thinner than that of the video signal line 2, thus, the influence of the reflection from the side surface of the common metal wiring 1091 is not big.

A thickness of the common metal wiring may become as thick as approximately 130 nm when the common metal wiring 1091 is used as an electrode for a touch panel; even in that case, the thickness of the metal wiring 1091 is approximately one fifth of the thickness of the video signal line 2; thus, the influence is small. In addition, if a taper etching is applied to the common metal wiring 1091 in some extent as depicted in FIG. 9, the influence of the reflection from the side surface of the common metal wiring 1091 can be further decreased.

In such structures, it is evaluated a path of light from the backlight that impinges to the liquid crystal display panel in an oblique direction as depicted by the arrow, and reflected at the side surface of the video signal line 2. In the case of FIG. 5, the reflected light is not stopped by the common metal wiring 1091 that is formed above the video signal line 2. In the case of the structure of FIGS. 8 and 9, however, the side surface of the video signal line 2 inclines, consequently, the reflected light comes closer the normal line of the TFT substrate 100 as depicted by the arrow in FIG. 9; thus, the reflected light is stopped by the common metal wiring 1091 or by the black matrix 202, and doesn't go to the screen. Therefore, the line shaped irregularity in brightness, which appears along the video signal line, can be avoided; further, aggravation of the contrast of the screen can be avoided. By the way, in FIG. 8, the common metal wiring 1091 is formed at the side nearer to the liquid crystal layer 300 with respect to the common electrode 109; however, this invention is applicable, too, to the structure that the common metal wiring 1091 is formed under the common electrode 109 (namely at the side of the organic passivation film 108).

Figure 10:
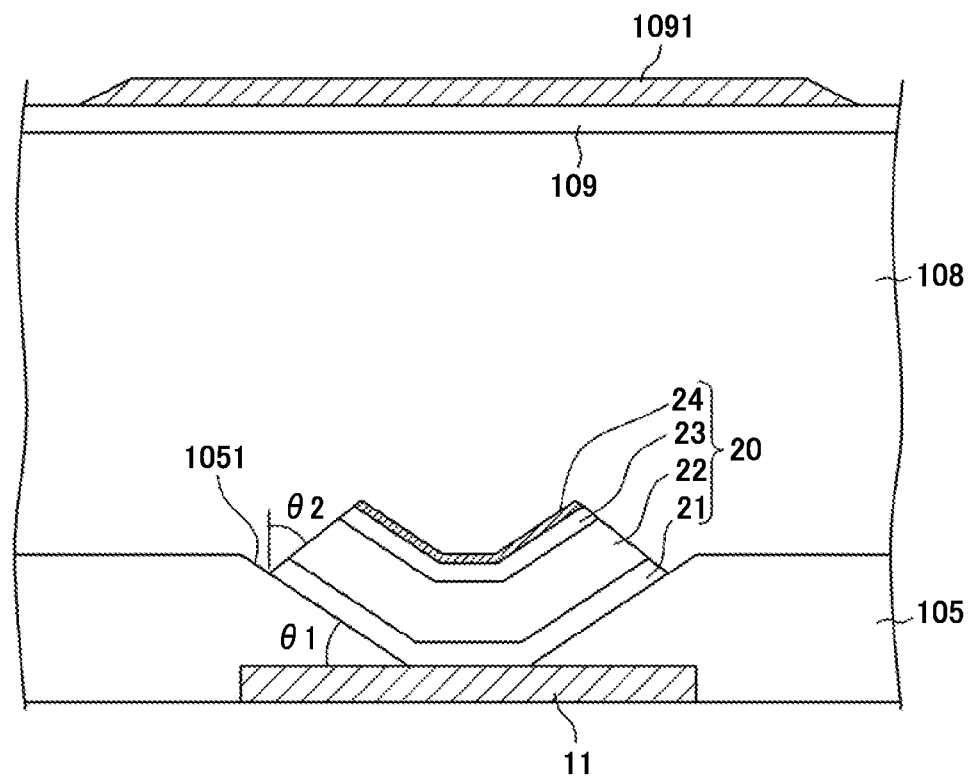
FIG. 10 is an enlarged cross sectional view at the video signal line of FIG. 7 according to another example.

FIG. 10 is a cross sectional view that the side surface of the video signal line 2 is made by taper etching. The structure of FIG. 10 is the same as the structure of FIG. 9 except the shape of the side edges of the video signal line 2. In FIG. 10, the angle of θ2, which is a tilt angle of the side surface of the video signal line 2 with respect to the normal direction of the TFT substrate 100, is bigger than the angle of θ1, which is an angle of inclination of the side wall of the groove like through hole 1051 formed in the interlayer insulating film 105, in an amount of an angle of taper etching in the side surface of the video signal line 2. As a result, the influence of the reflection of light from backlight is further reduced compared with the case in FIG. 9.

Figure 11:
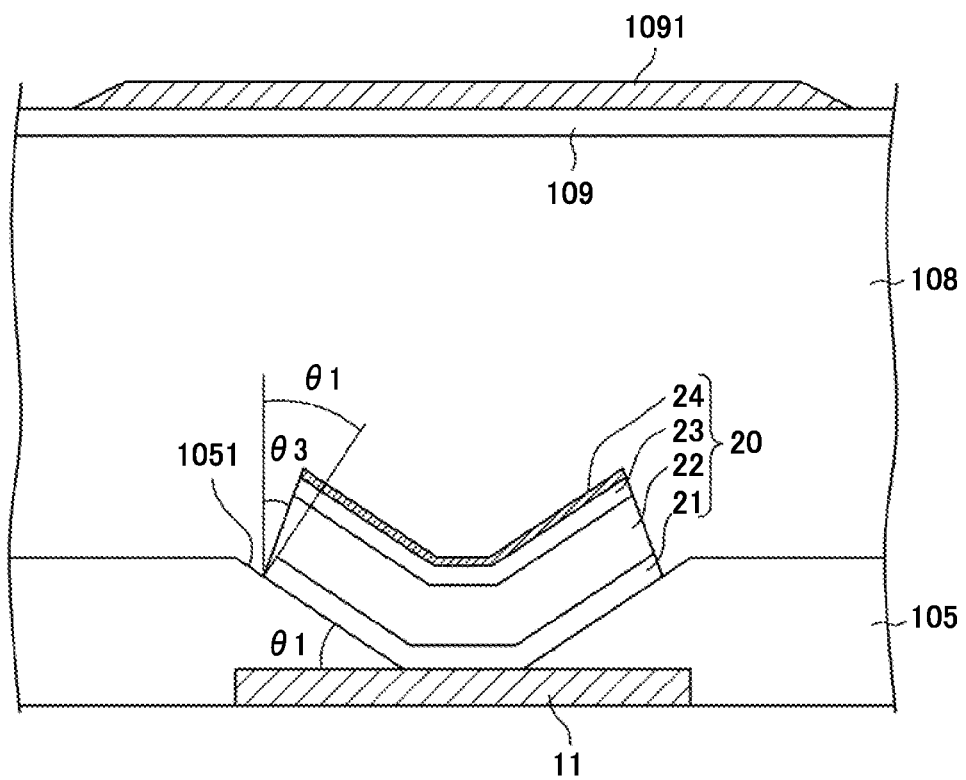
FIG. 11 is an enlarged cross sectional view at the video signal line of FIG. 7 according to yet another example.

FIG. 11, in reverse to FIG. 10, is a cross sectional view that the edge of the video signal line 2 is etched in a reverse taper. The structure of FIG. 11 is the same as the structure of FIG. 9 except the shape of the side edges of the video signal line 2. In FIG. 11, the angle of θ3, which is a tilt angle of the side surface of the video signal line 2 with respect to the normal direction of the TFT substrate 100, is smaller than the angle of θ1, which is an angle of inclination of the side wall of the groove like through hole 1051 formed in the interlayer insulating film 105, in an amount of an angle of reverse taper etching in the side surface of the video signal line 2.

Even in this structure, as far as the angle of θ3 is bigger than zero, similar effects of the invention is attainable. Concretely, if the angle of θ3 is 15 degree or more, the same effects as explained in FIGS. 9 and 10 are attainable. Further, if the edge of the video signal line 2 is on the side wall of the groove like through hole 1051, it is easier to make by etching the cross section of the video signal line 2 in FIG. 11 than the cross section of the video signal line 2 in FIGS. 9 and 10, in some occasions.

In FIGS. 3 and 7, the video signal line 2 extends in a perpendicular direction to the scan line 1; however, the present invention can also be applied when an extending direction of the video signal line 2 tilts some angle with respect to the direction perpendicular to the scan line 1.

The above explanation was made under the premise that the common metal wiring 1091 exists; however, when the common metal wiring doesn't exist, the black matrix 202 formed on the counter substrate 200 can have a role as the common metal wiring 1091. Thus, the present invention is applicable even when the common metal wiring 1091 doesn't exist.

What is claimed is:

1. A liquid crystal display device comprising:
a TFT substrate including a scan line and a video signal line, a counter substrate opposing to the TFT substrate, and a liquid crystal layer sandwiched between the TFT substrate and the counter substrate,
wherein an interlayer insulating film is formed between the scan line and the video signal line,
a groove like recess is formed in the interlayer insulating film superposing with the video signal line,
wherein the groove like recess has a side wall, the edge of the video signal line exists on the side wall of the groove like recess in cross sectional view,
the edge of the video signal line has a side surface in cross sectional view, the side surface tilts in a first angle to the normal direction of the TFT substrate so that side surface faces a major surface of the liquid crystal layer.

2. The liquid crystal display device according to claim 1, wherein the first angle is 15 degree or more.

3. The liquid crystal display device according to claim 2, wherein the first angle is 45 degree or less.

4. The liquid crystal display device according to claim 1, wherein the side wall of the groove like recess has an angle with respect to the major surface of the TFT substrate,
the angle is 15 degree or more.

5. The liquid crystal display device according to claim 1, wherein the side wall of the groove like recess has an angle with respect to the major surface of the TFT substrate,
the angle is 45 degree or less.

6. The liquid crystal display device according to claim 1, wherein the groove like recess does not overlap with the scan line.

7. The liquid crystal display device according to claim 1, an insulating film is formed over the video signal line,
a common electrode is formed on the insulating film,
a common metal wiring is formed superposing with the video signal line in a plan view and contacts with the common electrode,
a width of the common metal wiring in a direction that the scan line extends is bigger than a width of the video signal line in the direction that the scan line extends.

8. The liquid crystal display device according to claim 7, wherein a thickness of the common metal wiring is smaller than a thickness of the video signal line.

9. The liquid crystal display device according to claim 8, wherein, on the counter substrate, a black matrix is formed superposing the video signal line in a plan view,
a width of the black matrix in a direction that the scan line extends is bigger than a width of the video signal line in the direction that the scan line extends.

10. The liquid crystal display device according to claim 1, wherein a metal layer is formed superposing the groove like recess on a same layer as the scan line.

11. The liquid crystal display device according to claim 10,
wherein the metal layer is made of the material that is the same as the scan line, and the metal layer is segmented by the scan line.

12. The liquid crystal display device according to claim 10,
wherein a width of the metal layer in a direction that the scan line extends is the same or less than a width of the groove line recess in cross section in the direction that the scan line extends.

13. The liquid crystal display device according to claim 1, the liquid crystal display device is an IPS type liquid crystal display device.

14. A liquid crystal display device comprising:
a TFT substrate including a scan line and a video signal line, a counter substrate opposing to the TFT substrate, and a liquid crystal layer sandwiched between the TFT substrate and the counter substrate,
wherein the video signal line has a first portion that is parallel with a major surface of the TFT substrate in cross sectional view, and a second portion that is inclined with the major surface of the TFT substrate,
the video signal line includes only the first portion in a region overlapping the scan line,
the video signal line includes the first portion and the second portion disposed on both sides of the first portion in a region not overlapping the scan line,
an edge of the video signal line has a side surface in cross sectional view, the side surface tilts in a first angle to the normal direction of the TFT substrate so that side surface faces a major surface of the liquid crystal layer.

15. The liquid crystal display device according to claim 14,
wherein an interlayer insulating film is formed between a first layer where the scan line is formed and a second layer where the second portion of the video signal line is formed,
a groove like recess is formed in the interlayer insulating film where the first portion of the video signal line exists.

16. The liquid crystal display device according to claim 15,
wherein the groove like recess has an inclined portion that has an inclining angle between 15 degree and 45 degree with respect to the major surface of the TFT substrate.

17. The liquid crystal display device according to claim 15,
wherein a metal layer is formed at a TFT substrate side of the groove like recess,
the metal layer is formed on the first layer,
the metal layer is electrically insulated from the scan line.

* * * * *